(12) United States Patent
Berkompas

(10) Patent No.: US 8,684,803 B2
(45) Date of Patent: Apr. 1, 2014

(54) VENT STRUCTURE FORCING A Z-PATTERN AIR FLOW

(75) Inventor: Brent Berkompas, San Clemente, CA (US)

(73) Assignee: Brandguard Vents, San Clemente, CA (US)

( * ) Notice: Subject to any disclaimer, the term of this patent is extended or adjusted under 35 U.S.C. 154(b) by 557 days.

(21) Appl. No.: 11/441,894

(22) Filed: May 26, 2006

(65) Prior Publication Data

US 2007/0275652 A1 Nov. 29, 2007

(51) Int. Cl.
 *F24F 7/00* (2006.01)
(52) U.S. Cl.
 USPC .......................................... 454/277
(58) Field of Classification Search
 USPC .................................. 454/277, 279
 See application file for complete search history.

(56) References Cited

U.S. PATENT DOCUMENTS

| | | | |
|---|---|---|---|
| 313,865 A | 3/1885 | Hayes | |
| 925,144 A | 6/1909 | Ward | |
| 1,673,906 A | 3/1928 | Fager | |
| 1,995,456 A * | 3/1935 | Kannel | 454/224 |
| D194,410 S | 1/1963 | Bishop | |
| 3,303,622 A | 2/1967 | Minds | |
| 3,625,136 A | 12/1971 | Dininno | |
| 4,078,477 A | 3/1978 | Sommer | |
| 4,103,468 A * | 8/1978 | Olsen | 52/473 |
| 4,145,032 A * | 3/1979 | Robertson | 256/73 |
| 4,901,387 A * | 2/1990 | Luke | 5/730 |
| 5,254,034 A * | 10/1993 | Roth | 454/277 |
| 5,542,224 A | 8/1996 | Olsen | |
| 6,015,343 A * | 1/2000 | Castillo et al. | 454/365 |
| 6,138,424 A | 10/2000 | Akerson et al. | |
| 2002/0100232 A1* | 8/2002 | Robinson et al. | 52/198 |
| 2003/0050006 A1 | 3/2003 | Myint | |
| 2003/0167726 A1* | 9/2003 | Dunleavy et al. | 52/741.3 |

* cited by examiner

*Primary Examiner* — Kang Hu
*Assistant Examiner* — Samantha Miller
(74) *Attorney, Agent, or Firm* — Fish & Associates, PC

(57) ABSTRACT

A vent is mounted in a building wall so as to enable air exchange between the interior of the building and the outside environment. A first set of plural, spaced apart, air guide members and a second set of plural, spaced apart, air guide members are formed using elongate units each having a base element contiguous with opposing leg elements. The base elements of the first set of guide members are arranged in a first vertical plane, while the base elements of the second set of guide members are arranged in a second vertical plane, wherein the planes are in parallel horizontal mutual displacement. The leg elements of the two sets of air guide members are positioned and interlaced to force air flow moving through the apparatus is make a first right angle turn followed by a "Z" shaped turn and then a second right angle turn.

7 Claims, 3 Drawing Sheets

VENT STRUCTURE FORCING A Z-PATTERN AIR FLOW

CROSS-REFERENCE TO RELATED APPLICATIONS

Not applicable.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

INCORPORATION-BY-REFERENCE OF MATERIAL SUBMITTTED ON A COMPACT DISC

Not applicable.

REFERENCE TO A "MICROFICHE APPENDIX"

Not applicable.

BACKGROUND OF THE INVENTION

1. Field of the Present Disclosure

This disclosure relates generally to vent and grill structures and more particularly to a vent with parallel vertically arranged elements formed so as to force air to flow in a "Z" pattern.

2. Description of Related Art Including Information Disclosed Under 37 CFR 1.97 and 1.98

Myint, U.S. 2003/00500006, discloses an air vent to safeguard the security of the public potable water system, especially in such enclosed structures as reservoirs and clear wells and other vital air vented installations against sabotages, vandalism and accidental contamination by animals and birds. Conventional air vents allow the free movement of air in and out of an enclosed structures, but will not stop the penetration of other liquids or solids from getting through vent openings. The described vent does not allow any liquids or solids to move through the vent, even when they are applied under pressure, yet it functions as a normal air vent allowing free movements of air in and out at all times. Bishop, Des. Pat. No. 194410, describes a louver for air conditioning systems or the like. Hayes, U.S. Pat. No. 313,865, discloses a panel of sheet metal formed as a continuous sheet bent outwardly and inwardly at intervals to constitute a series of double-chambered louvers, one chamber open to the interior of the structure and the other chamber open to the exterior with the partition between the chambers provided with apertures for air-passage. Ward, U.S. Pat. No. 925,144, discloses a ventilator, a frame, a series of flanged walls arranged on opposite sides of the frame and in staggered relation with respect to one another, and a plurality of removable transparent baffle plates positioned within the flanged walls for directing the flow and travel of the admitted air. Fager, U.S. Pat. No. 1,673,906, discloses a ventilator formed of two interfitting parts, the parts formed of sheet metal having potions struck up from the plane of the sheet metal from which they are formed, the portions comprising frames and cross strips extending across the frames, the cross strips having wings inclined to the planes of the cross strips, the cross strips being so located relative to each other that the spaces between the inclined edge portions of the cross strips of one part will be located opposite the center lines of the cross strips of the other parts, one of the frames having inturned edge portions, a screen clamed between the inturned edge portions and extending the length of the frame and substantially in contact with the edges of the inclines portions of the strips. Kannel, U.S. Pat. No. 1,995,456, discloses a ventilator unit comprising a frame, opposing sets of shutter members formed of angularly bent material disposed in the frame, the shutter members of one set overlapping the shutter members of the other set so as to present a tortuous passageway having opposing pockets, one set of shutters being hingedly mounted in the frame as a unit and movable to and from cooperative relations with respect to the companion set of shutters. Minds, U.S. Pat. No. 3,303,622, discloses an improved wall structure comprising: a pair of spaced apart panel retaining members; each of the panel retaining members comprising an I-beam with the upper flange of one of the I-beams being in opposing relationship to the lower flange of the other I-beams; at least one panel coupled to and between the I-beams, each of the I-beams including on at least one side thereof at least two projecting portions, the projecting portions being disposed in the upper flange of the one-I-beams and in the lower flange of the other of the I-beams, the projecting portions defining with the retaining members spaced apart notches, and the panel including angled edge portions interlocked, respectively with the opposing notches of the projecting portions of the space apart I-beams in the flanges aforementioned. Dininno, U.S. Pat. No. 3,625,136, discloses a louver assembly for a building wall or the like, that includes inner blades which are spaced apart to provide longitudinal openings for ventilating the building, and outer blades which confront the longitudinal openings. A strip of wire mesh confronts each longitudinal opening and prevents ingress of extraneous material, such as debris and birds for example. Bracket means connects each outer blade directly to adjacent ones of the inner blades. The bracket means fixes the spacing between adjacent inner blades and the spacing between the inner blades and the outer blades. Sommer, U.S. Pat. No. 4,078,477, discloses a protective screen or grating, especially a protective screen or grating for drift or blown sand or the like, for an electrical air-cooled machine, comprising essentially vertically arranged profile ledge members disposed in at least two rows, the profile ledge members being provided with at least one row of guide devices located downstream with respect to the flow direction of the cooling air and forming channel walls. Olsen, U.S. Pat. No. 5,542,224, discloses a louver that has vertical blades arranged in a frame alternately in a staggered relation from front to back in a front and a rear row. The blades in at least the front row have a web oriented substantially perpendicularly to the plane of the frame and substantially parallel to the jambs, a pair of front flanges extending in opposite directions generally laterally from a front edge of the web, and a pair of rear flanges extending in opposite directions generally laterally from a rear edge of the web. The webs subdivide the air flow volume within the frame into flow channels, each of which is partially blocked laterally by the front flanges and the rear flanges of the blades of the front row. The blades of the rear row have flanges that block the portions of is the channels between the extremities of the flanges of the blades of the front row. The flanges of the adjacent blades overlap so that there is no straight path through the flow channels along which air and water entrained in the air can pass perpendicularly to the plane of the frame and the air flows along a tortuous flow path of approximately constant area. The flanges are configured to control and trap water impinging on them. Akerson et al., U.S. Pat. No. 6,138,424, discloses a vent apparatus for a building that includes a frame within which are positioned two spaced sets of louvers. The louvers of each set of louvers have openings therebetween and the openings of each set of louvers are covered by the louvers of the other set of louvers.

The related art described above discloses several air vent structures including Sommer which teaches that a screen may include plural inlet paths which are covered by caps so that air inflow gains entrance to the inlet paths only from a lateral direction. Akerson et al teaches an interleaved arrangement of baffles that prevents a straight line entry path. Olsen teaches a matrix of "I" shaped elements that also prevents a direct path and forces air to move laterally as well as through the labyrinth. Dininno, Kannel, Fager, Ward, Hayes, Myint and Minds each teaches a baffle arrangement that forces an air stream to essentially reverse direction twice during transit. However, the prior art fails to disclose a vent baffle arrangement that forcing a torturous air flow path that retroflow so that glowing embers are prevented from entering a building structure due to the fact that they are caused to essentially reverse direction and with forward flow reversed they drop to the bottom of the vent structure. The present disclosure distinguishes over the prior art providing heretofore unknown advantages as described in the following summary.

BRIEF SUMMARY OF THE INVENTION

This disclosure teaches certain benefits in construction and use which give rise to the objectives described below.

The present invention is a static vent which when mounted in a building wall structure provides venting of an attic space, for instance, by enabling air exchange between the interior of the attic and the outside environment. Such vents are also used for venting storage rooms, equipment rooms and similar spaces. The overall objective of such static vents is to prevent air pressure differentials between the vented space and the natural environment. However, during external brush fire conditions, the prior art vent structures are not generally capable of preventing fire brands from entering building spaces through prior art vent structures because heated air from such fires is known to move with great speed and force against building structures and pressure differentials between building interiors and highly heated outside air can occur quickly and with significant magnitude as to cause an inrush of such air through prior art vents. When this happens, it is well known, that live fire brands move into attic spaces and can cause great destruction.

The present invention vent structure is improved over the prior art as it throttles inrushing air flows and twice causes air flow to reverse direction. Throttling occurs because the present invention is fabricated with narrow chambers set between relatively wider inlet and outlet ports. The narrow chambers cause any inrush of air to back up acting as a governor on air inflow rate. As the pressure differential across the vent structure increases, the air flow rate is throttled through the narrow chambers so that velocity is dampened and this alone causes airborne debris to settle as is well known. By causing the inflow to reverse direction, the dampened air flow velocity reaches zero momentarily. By achieving zero flow rate gravitational forces dominate the dynamic forces of air-lift. This seemingly simple measure has been shown by extensive tests to prevent most fire brands from moving through the present venting structure.

The vent structure of the present invention is made up of several separate sheet metal elements welded, or otherwise connected, together. A first set of plural, spaced apart, air guide members and a second set of plural, spaced apart, air guide members are formed using elongate units each having a base contiguous with opposing legs. The base of the first set of guide members are arranged in a first vertical plane, while the base of the second set of guide members are arranged in a second vertical plane, and the planes are in parallel horizontal mutual displacement. The legs of the two sets of air guide members are positioned in an interlaced arrangement to force air flow moving through the apparatus to make a first right angle turn followed by a "Z" shaped turn and then a second right angle turn. In this manner, it is difficult for a live fire brand to move through the vent structure to gain access to the interior of the building.

A primary objective inherent in the above described apparatus and method of use is to provide advantages not taught by the prior art.

Another objective is to make a relatively simple vent structure that is inexpensive to manufacture.

A further objective is to form the vent structure that throttles air flow through it.

A still further objective is to provide such a structure that inhibits the movement of particles through it.

A still further objective is to form such a vent structure such that particulate debris carried on air moving through the vent structure is able to fall directly to the bottom of the vent structure.

A yet further objective is to form such a vent structure with an air path that changes direction a number of times and reverses its direction.

Other features and advantages of the present invention will become apparent from the following more detailed description, taken in conjunction with the accompanying drawings, which illustrate, by way of example, the principles of the presently described apparatus and method of its use.

BRIEF DESCRIPTION OF THE SEVERAL VIEWS OF THE DRAWING(S)

Illustrated in the accompanying drawing(s) is at least one of the best mode embodiments of the present invention In such drawing(s):

DETAILED DESCRIPTION OF THE INVENTION

The above described drawing figures illustrate the described apparatus and its method of use in at least one of its preferred, best mode embodiment, which is further defined in detail in the following description. Those having ordinary skill in the art may be able to make alterations and modifications what is described herein without departing from its spirit and scope. Therefore, it must be understood that what is illustrated is set forth only for the purposes of example and that it should not be taken as a limitation in the scope of the present apparatus and method of use.

Figure 1:
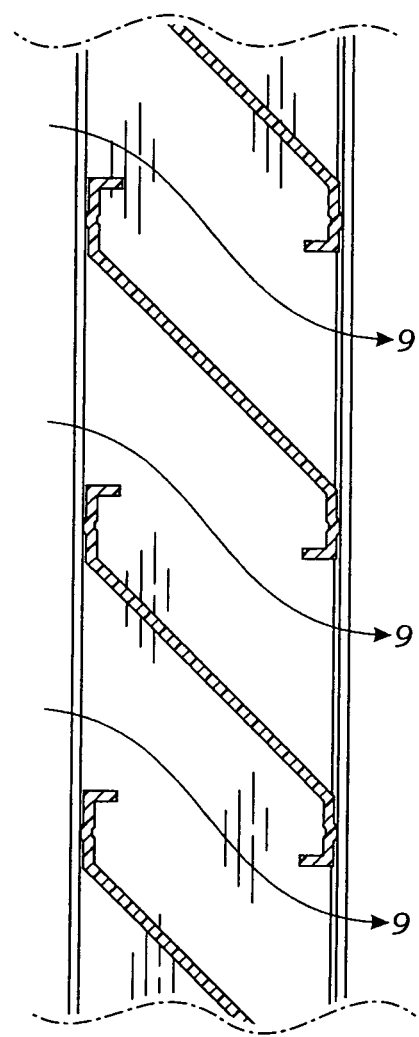
FIG. 1 is a section view taken along a vertical cut through a prior art vent apparatus.
Figure 2:
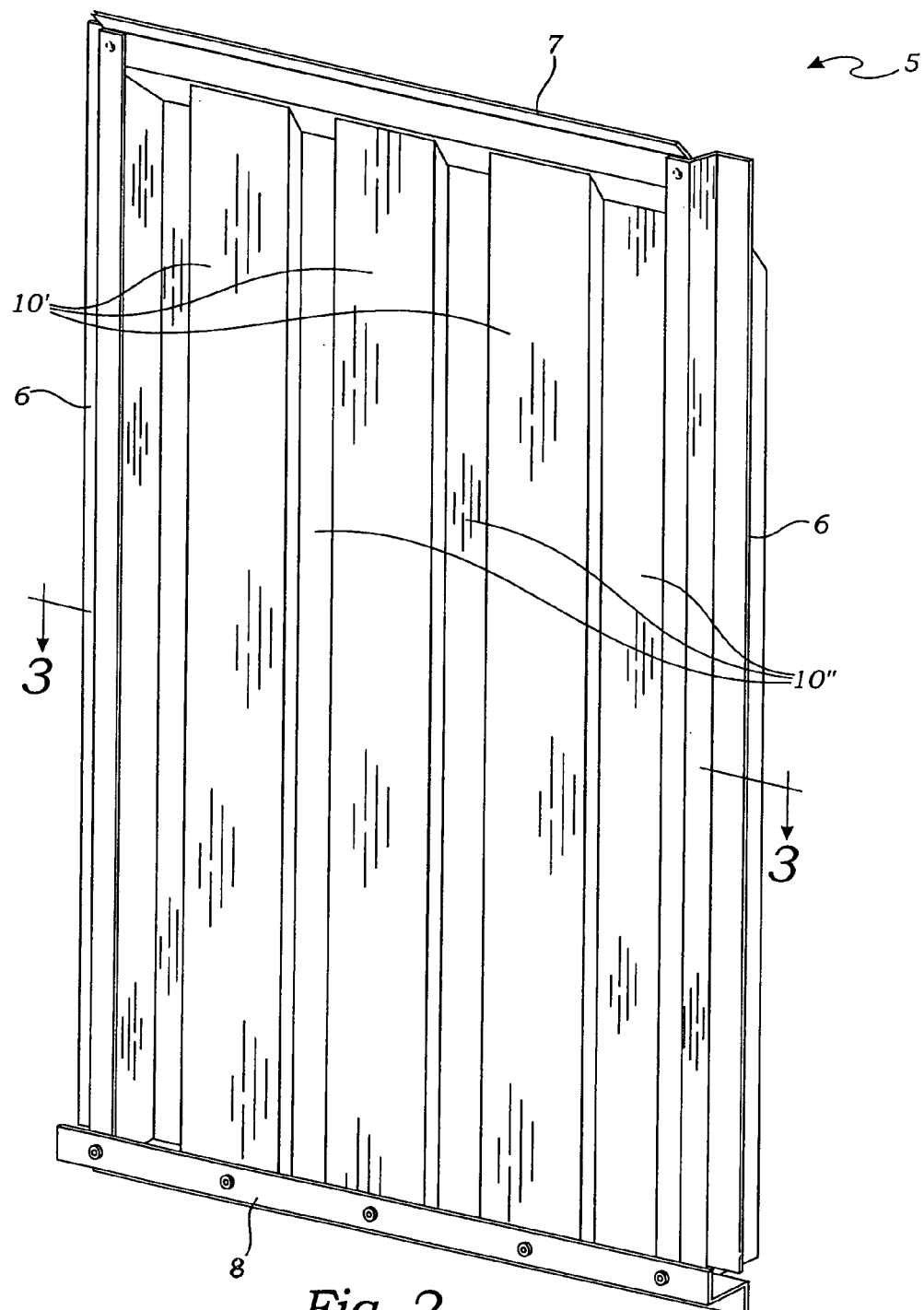
FIG. 2 is a perspective view of the present invention.

As can be seen in FIG. 1, the prior art teaches that it is beneficial to direct air flow through a static vent with some lateral movement, i.e., it is not possible to see through the vent directly. Described now in detail is a vent apparatus assembled in a box frame 5 as shown in FIG. 2. The box frame 5 is preferably made of aluminum sheet metal formed L-pieces or U-channels. Alternatively, these elements may be made by an extrusion process. The elements of the box frame 5 preferably comprise two spaced apart sides struts 6, a top strut 7 and a bottom strut 8 and is preferably square or rectangular in overall shape. These four struts 6, 7 and 8 are joined by welding or riveting preferably, but may also be fastened together by alternative means such as by common hardware fasteners.

Within the frame 5 are mounted a first set of plural, spaced apart, air guide members 10' and a second set of plural, spaced apart, air guide members 10". Members 10' and 10" are preferably made of the same materials as the frame 5 and are formed using similar or identical processes. Each of the air guide members 10' and 10" is formed integrally as a planar and elongate base element 12 contiguous with opposing planar and elongate leg elements 14 formed on either side of the base element 12.

Figure 3:
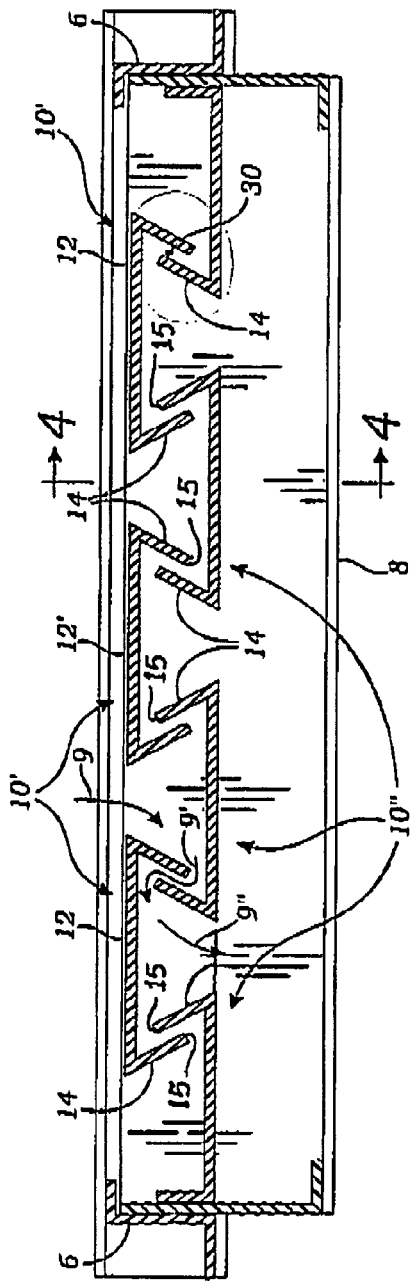
FIG. 3 is a section view of the present apparatus as taken along cutting plane 3-3 in FIG. 2.
Figure 4:
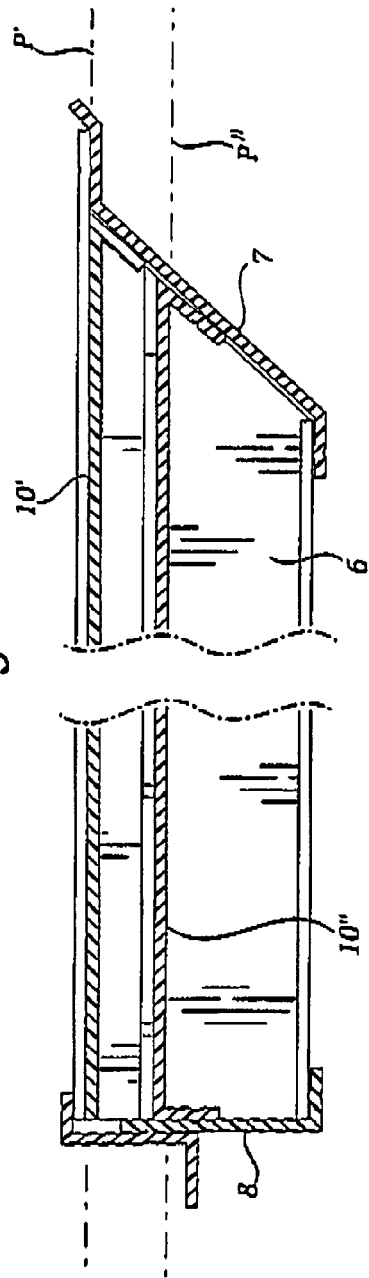
FIG. 4 is a section view of the present apparatus as taken along cutting plane 4-4 in FIG. 3.

The base elements 12 of the first set of guide members 10' are arranged in a row and are spaced apart in a first vertical plane P' while the base elements 12 of the second set of guide members 10" are arranged in the same fashion in a second vertical plane P" as shown in FIG. 4. The second plane P" is horizontally displaced with respect to the first plane P' so that the members 10' and 10" form two parallel rows and the leg elements 14 of one of the rows faces the leg elements 14 of the other of the rows as shown in FIG. 3.

The leg elements 14 of the first set (inlet) air guide members 10' are positioned in interleaved engagement with the leg elements 14 of the second set (outlet) air guide members 10" so that their mutual juxtaposition forces air flow 6 moving through the apparatus to make a first right angle turn R' followed by a "Z" shaped turn Z, and then a second right angle turn R". To accomplish this, the leg elements 14 are formed at an acute angle with respect to the base elements 12, so that the leg elements 14 on each of the base elements 12 are directed at an angle toward each other, i.e., convergent. Furthermore, the inlet air guide members 10' are positioned with respect to the outlet air guide members 10" in such close proximity that a terminal end 15 of each of the inlet leg elements 14 of the inlet air guide members 10' are set in closer proximity to the outlet base elements 12 of the outlet air guide members 10" than is the terminal end 15 of the outlet leg elements 14 of the outlet air guide members 10", a narrow passage 30 thereby formed between said inlet leg elements 14 and the outlet leg elements 14.

Preferably, the air guide members 10' and 10" are oriented vertically so that live embers entering the apparatus are able to fall under the influence of gravity to the bottom of the box frame 5.

As can be seen in FIG. 3 the leg elements 14 are mutually arranged and interleaved to form narrow passages 30 between the first 10' and second 10" sets of air guide members, these narrow passages 30 are preferably set at an angle of approximately 45 degrees with respect to the first and second planes P' and P" thereby forcing air to move through the apparatus in the first right angle turn R' followed by the "Z" shaped turn Z through the narrow passages 30, and then the second right angle turn R". It has been found that air flow moving in this way tends to drop any particulate matter borne aloft. Also, when such particulate matter is dropped, it falls vertically without hindrance to the bottom of the present apparatus. Due to the results of extensive tests conducted by an independent laboratory on prototypes of the present invention, we are certain that the Z-shaped air flow pattern is the cause of this improved ability to eliminate the movement of air borne particles through the present apparatus. The cause of the superior operating characteristics of the present invention is the fact that air movement in entering passages 30 and in leaving passages 30 is required to almost reverse direction (retroflow). Preferably, the space between adjacent first air guide members 10' and also between adjacent second air guide members 10" is approximately 1.5 inches while the space between legs 14 of each pair of adjacent first and second air guide members is approximately 0.375 inches. This means that for each roughly 1.5 inches of inlet space for air inflow between the first air guide members 10', and between the second air guide members 10", there is only about /3;4of an inch of channel space between adjacent legs 14 of first and second air guide members. This means that the volume of air flowing into the instant structure is caused to move through channels with only about one-half the open area as that of the space between adjacent ones of the air guide members. The series of right and acute angles that, as stated, a severe throttling effect which is more pronounced as the air pressure delta across the invention increases. This reduction is cross-sectional area normally would tend to increase air flow velocity through the instant structure, except that in the present apparatus, the inflow air vector is required to make two direction changes, each being nearly a full reversal in direction. It has been found that this actually causes net air flow velocity to diminish, again, with the diminished air flow velocity effect being more pronounced as the pressure across the vent structure increases.

The enablements described in detail above are considered novel over the prior art of record and are considered critical to the operation of at least one aspect of the apparatus and its method of use and to the achievement of the above described objectives. The words used in this specification to describe the instant embodiments are to be understood not only in the sense of their commonly defined meanings, but to include by special definition in this specification: structure, material or acts beyond the scope of the commonly defined meanings. Thus if an element can be understood in the context of this specification as including more than one meaning, then its use must be understood as being generic to all possible meanings supported by the specification and by the word or words describing the element.

The definitions of the words or drawing elements described herein are meant to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements described and its various embodiments or that a single element may be substituted for two or more elements in a claim.

Changes from the claimed subject matter as viewed by a person with ordinary skill in the art, now known or later devised, are expressly contemplated as being equivalents within the scope intended and its various embodiments. Therefore, obvious substitutions now or later known to one with ordinary skill in the art are defined to be within the scope of the defined elements. This disclosure is thus meant to be understood to include what is specifically illustrated and described above, what is conceptually equivalent, what can be obviously substituted, and also what incorporates the essential ideas.

The scope of this description is to be interpreted only in conjunction with the appended claims and it is made clear, here, that each named inventor believes that the claimed subject matter is what is intended to be patented.

What is claimed is:

1. A method of preventing fire brands from entering a building, comprising the steps of:
   providing a vent apparatus that comprises a frame defining an inlet side, an outlet side, and an internal passage extending from the inlet side to the outlet side defined by a plurality of inlet guide members and outlet guide members,
   wherein the inlet guide members and outlet guide members each comprises (i) a base portion and (ii) a first leg and a second leg second extending from the base portion at 45 degree angles and convergent with one another;
   wherein the inlet guide members are spaced apart from one another to form a plurality of inlet spaces therebetween;
   wherein the leg portions of the inlet guide members are positioned relative to the leg portions of the outlet guide members to form a plurality of narrow passages;
   wherein the internal passage directs air flow to make a (i) a first 90-degree turn, (ii) a Z-shaped turn defined by (a) a 45 degree angle of an inlet leg element and (b) a 45 degree angle of an outlet leg element, and (iii) a second 90-degree turn; and
   wherein each inlet space has a corresponding channel space defined by (i) a first narrow passages between a first inlet leg element and a first outlet leg element and and (ii) a second narrow passages between a second inlet leg element a second outlet leg element;
   wherein the channel space is less than about one half of the inlet space, thereby producing a throttling effect that inhibits fire brands from passing through the internal passage.

2. The method of claim 1, wherein the inlet guide members are formed of sheet metal.

3. The method of claim 1, wherein the base portion is planar in form.

4. The method of claim 1, wherein the first and second legs of the inlet guide members and outlet guide members are each planar in form.

5. The method of claim 1, wherein the first leg of the inlet guide members are parallel to the first leg of the outlet guide members.

6. The method of claim 5, wherein the second leg of the inlet guide members is parallel to the second leg of the outlet guide members.

7. The method of claim 1, wherein the narrow passages are about 0.375 inches, the channel space is about 0.75 inches, and the inlet space is about 1.5 inches.

* * * * *